(12) United States Patent
Watanabe (10) Patent No.: US 12,429,808 B2
(45) Date of Patent: Sep. 30, 2025

(54) CONTROL BOARD, ELECTRONIC EQUIPMENT, AND IMAGE FORMING APPARATUS

(71) Applicant: Kenichi Watanabe, Kanagawa (JP)

(72) Inventor: Kenichi Watanabe, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 18/250,100

(22) PCT Filed: Nov. 10, 2021

(86) PCT No.: PCT/JP2021/041412
§ 371 (c)(1),
(2) Date: Oct. 26, 2023

(87) PCT Pub. No.: WO2022/102677
PCT Pub. Date: May 19, 2022

(65) Prior Publication Data
US 2023/0393516 A1    Dec. 7, 2023

(30) Foreign Application Priority Data

Nov. 13, 2020    (JP) .................................. 2020-189783

(51) Int. Cl.
*G03G 15/00*    (2006.01)
*H05K 1/02*    (2006.01)
(Continued)

(52) U.S. Cl.
CPC ........... *G03G 15/80* (2013.01); *H05K 1/0203* (2013.01); *H10N 10/13* (2023.02); *H10N 10/82* (2023.02); *H05K 2201/10219* (2013.01)

(58) Field of Classification Search
CPC ..... G03G 15/80; H01L 23/3672; H01L 35/30; H01L 35/32; H05K 1/0203; H05K 2201/10219; H10N 10/13; H10N 10/82
See application file for complete search history.

(56) References Cited

U.S. PATENT DOCUMENTS 9,429,909 B2 *   8/2016   Shirai ................... G03G 15/80
10,600,948 B1 *   3/2020   Liu ..................... H01L 23/3672
(Continued)

FOREIGN PATENT DOCUMENTS

EP          2613348       7/2013
JP     2009-231729 A    10/2009
(Continued)

OTHER PUBLICATIONS

International Search Report for PCT/JP2021/041412 mailed on Feb. 11, 2022.
(Continued)

*Primary Examiner* — Hoang X Ngo
(74) *Attorney, Agent, or Firm* — Harness, Dickey & Pierce, P.L.C.

(57) ABSTRACT

To provide a control board for efficiently generating electric energy in a power generating device from heat generated from an electronic device. A control board includes a board including a first heat dissipating pad; an electronic device including a second heat dissipating pad to dissipate heat; a power generating device including a Peltier device which converts heat energy generated from the electronic device into electric energy, wherein the power generating device is sandwiched between the first heat dissipating pad and the second heat dissipating pad; and a power supply circuit configured to reuse the electric energy.

11 Claims, 8 Drawing Sheets

(51) Int. Cl.
  *H10N 10/13*  (2023.01)
  *H10N 10/82*  (2023.01)

(56) References Cited

U.S. PATENT DOCUMENTS

| | | |
|---|---|---|
| 2015/0003017 A1 | 1/2015 | Tantolin et al. |
| 2016/0077475 A1 | 3/2016 | Ehara et al. |

FOREIGN PATENT DOCUMENTS

| | | |
|---|---|---|
| JP | 2010-205818 A | 9/2010 |
| JP | 2014-027186 | 2/2014 |
| JP | 2016-061835 | 4/2016 |
| JP | 2019-159068 | 9/2019 |

OTHER PUBLICATIONS

Written Opinion for PCT/JP2021/041412 mailed on Feb. 11, 2022.
Japanese Office Action dated Aug. 6, 2024 issued in corresponding Japanese Appln. No. 2020-189783.

\* cited by examiner

CONTROL BOARD, ELECTRONIC EQUIPMENT, AND IMAGE FORMING APPARATUS

CROSS-REFERENCE TO RELATED APPLICATIONS

This application is a national phase under 35 U.S.C. § 371 of PCT International Application No. PCT/JP2021/041412 which has an International filing date of Nov. 10, 2021, which claims priority to JP Application No. 2020-189783, filed Nov. 13, 2020, the entire contents of each of which are hereby incorporated by reference.

TECHNICAL FIELD

The disclosures herein generally relate to a control board, an electronic equipment, and an image forming apparatus.

BACKGROUND ART

Devices that generate electric energy by utilizing waste heat of electronic equipment are known. A technique for reusing energy by storing electric energy generated from such a device in a battery such as a secondary battery is known.

A thermoelectric power generating element that generates electricity by a temperature difference between both ends of the element is known. Patent Document 1 discloses a shield structure in which electric power can be generated by the thermoelectric power generating element by utilizing heat generated from an electronic component, and electrical connection between the thermoelectric power generating element and a circuit board can be easily performed.

CITATION LIST

Patent Literature

[PTL 1] Japanese Unexamined Patent Application Publication No. 2014-027186

SUMMARY OF INVENTION

Technical Problem

An object of the present disclosure is to provide a control board for efficiently generating electric energy in a power generating device from heat generated from an electronic device.

Solution to Problem

According to one aspect of the present disclosure, a control board including: a board including a first heat dissipating pad; an electronic device including a second heat dissipating pad to dissipate heat; a power generating device including a Peltier device which converts heat energy generated from the electronic device into electric energy, wherein the power generating device is sandwiched between the first heat dissipating pad and the second heat dissipating pad; and a power supply circuit configured to reuse the electric energy, is provided.

Advantageous Effects of Invention

According to the control board of the present disclosure, electric energy can be efficiently generated by the power generating device from heat generated from the electronic device.

DESCRIPTION OF EMBODIMENTS

In the following, embodiments of the present invention will be described with reference to the accompanying drawings. In each of the drawings below, the same components may be designated by the same reference numerals and duplicate description may be omitted. Further, in order to facilitate understanding, the scale of each part in the drawing may differ from the actual scale. In directions of parallel, right angle, orthogonal, horizontal, vertical, up and down, left and right, etc., deviations are allowed to the extent that the effect of the embodiment is not impaired. A shape of a corner portion is not limited to a right angle, and may be rounded in a bow shape. Parallel, right angle, orthogonal, horizontal, and vertical may include substantially parallel, substantially right angle, substantially orthogonal, substantially horizontal, and substantially vertical, respectively.

A control board 1 according to the present embodiment will be described in detail below with reference to the accompanying drawings. The present invention is not limited to the embodiment.

<Control Board 1>

The control board 1 is used in an electronic equipment such as a printer or a multifunction peripheral.

Figure 1:
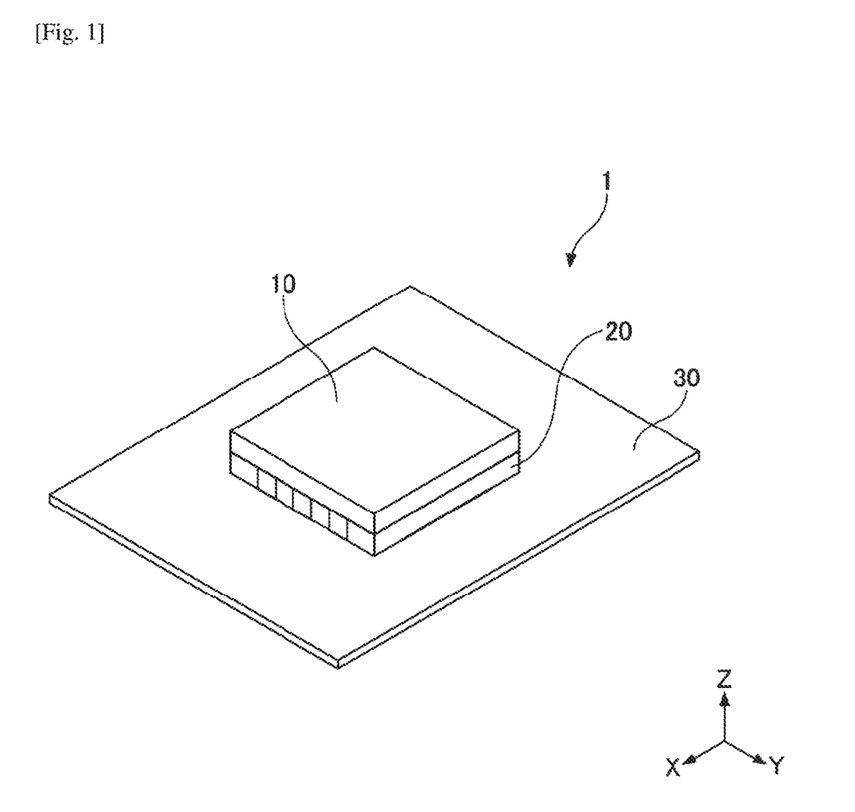
FIG. 1 is a perspective view of a control board according to the present embodiment.
Figure 2:
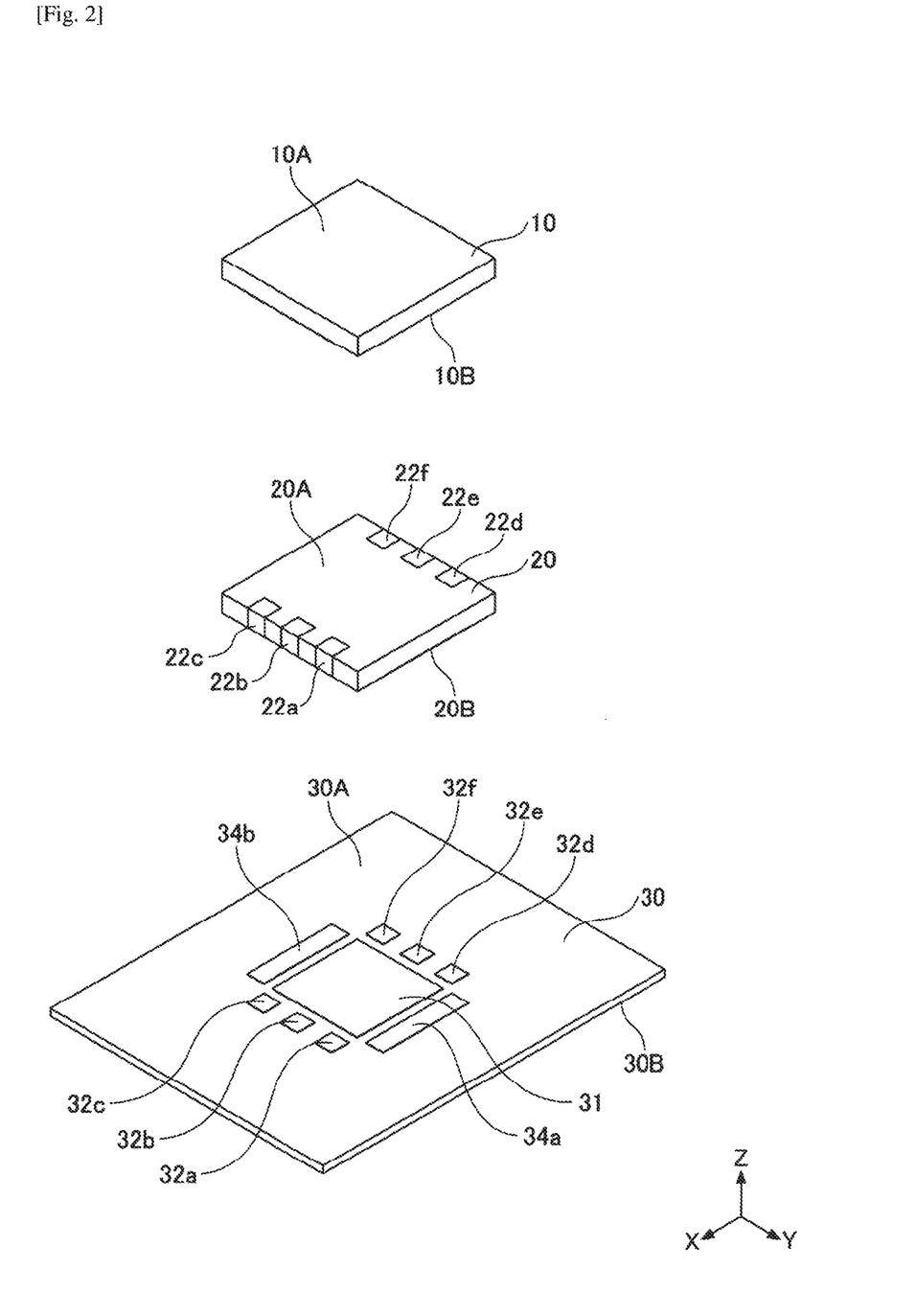
FIG. 2 is an exploded perspective view of the control board according to the present embodiment.

FIG. 1 is a perspective view of the control board 1 according to the present embodiment. FIG. 2 is an exploded perspective view of the control board 1 according to the present embodiment.

For convenience of explanation, a virtual three-dimensional coordinate system (XYZ Cartesian coordinate system) including an X-axis, a Y-axis, and a Z-axis (XYZ-axis) that are orthogonal to each other may be set in the figure. However, the coordinate system is defined for the sake of explanation, and does not limit a posture of the control board 1 and the like."

In the present disclosure, unless otherwise specified, the X-axis direction and the Y-axis direction are directions parallel to a main surface of a board 30 of the control board 1. The Z-axis is in a direction perpendicular to the X-axis and the Y-axis. A side on which an electronic device 10 and a power generating device 20 are mounted, that is, a +Z side with respect to the board 30 of the control board 1 may be referred to as a top side.

The control board 1 includes the electronic device 10, the power generating device 20, and the board 30. The electronic device 10 is an integrated circuit (IC) that performs a predetermined operation when the electronic equipment on which the control board 1 is mounted operates. The power generating device 20 has a first surface 20A and a second surface 20B, and is a device that generates power by a temperature difference between the first surface 20A and the second surface The power generating device 20 includes, for example, a Peltier device.

The board 30 is a board on which the electronic device 10 and the power generating device 20 are mounted. Further, the board 30 includes a power supply circuit 50 that reuses the electric energy generated from the power generating device 20.

The control board 1 of the present embodiment is provided such that the power generating device 20 is sandwiched between the electronic device 10 and the board 30. More specifically, the control board 1 is provided so as to sandwich the power generating device 20 between a heat dissipating pad 11 described later of the electronic device 10 and the heat dissipating pad 31 described later of the board 30. The power generating device 20 generates electricity due to the temperature difference between the heat dissipating pad 11 of the electronic device 10 and the heat dissipating pad 31 of the board 30.

(Electronic device 10)

Figure 3:
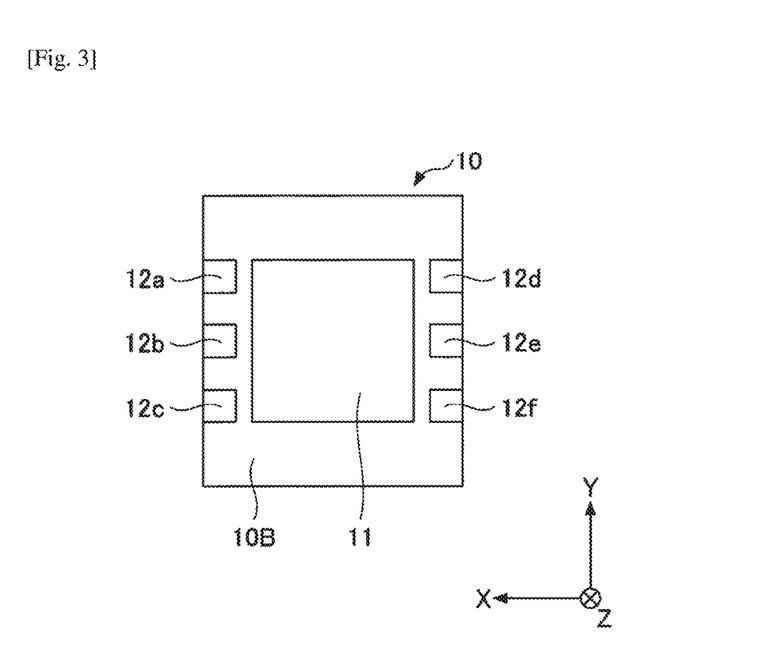
FIG. 3 is a bottom view of the electronic device of the control board according to the present embodiment.

FIG. 3 is a bottom view of the electronic device 10 of the control board 1 according to the present embodiment. The electronic device 10 is a device that generates a considerable amount of heat during operation. The electronic device 10 is, for example, a power supply IC. Hereinafter, the case where the electronic device 10 is the power supply IC will be described as an example.

The electronic device 10 includes the heat dissipating pad 11, and terminal pads 12a, 12b, 12c, 12d, 12e, and 12f.

(Heat Dissipating Pad 11)

The heat dissipating pad 11 is a pad for dissipating heat generated inside the electronic device 10. When the electronic device 10 is, for example, the power supply IC, the electronic device 10 which is the power supply IC includes a resistor inside the power supply IC in order to step down the power supply voltage supplied from the device to desired voltage. Then, a desired output voltage can be obtained from the power supply IC while converting the electric energy into heat energy by the resistor inside the power supply IC. The generated heat energy is dissipated to the outside of the power supply IC by coming into contact with air around the power supply IC.

However, since heat transfer efficiency of air is low, an internal temperature of the power supply IC becomes higher and higher, and the internal temperature of the power supply IC may exceed a temperature standard of the power supply IC. If the internal temperature of the power supply IC exceeds the temperature standard of the power supply IC, the power supply IC may be damaged.

Therefore, the electronic device 10 has the heat dissipating pad 11 in order to prevent damage due to heat. The heat dissipating pad 11 of the electronic device 10 is heated by receiving heat from a heat generating element inside the electronic device 10. A temperature of the electronic device 10 is lowered by dissipating heat from the heated heat dissipating pad 11.

For example, the heat dissipating pad 11 could be connected to a ground electrode of the printed board if the electronic device 10 was mounted thereon. Then, the temperature of the electronic device 10 could be reduced by connecting to the ground electrode of the printed board and releasing heat energy to the ground electrode. Since the ground electrode on the printed board has a large layout area, a low temperature can be maintained.

In the control board 1 of the present embodiment, the heat dissipating pad 11 is not directly connected to the heat dissipating pad 31 of the board 30 which is the printed board, but is thermally connected to the heat dissipating pad 31 via the power generating device 20 described later.

There is a temperature difference between the heat dissipating pad 11 of the electronic device 10 and the heat dissipating pad 31 of the board 30. Therefore, the heat energy is converted into electric energy by the power generating device 20 by using the temperature difference between the heat dissipating pad 11 of the electronic device 10 and the heat dissipating pad 31 of the board 30.

(Terminal Pads 12a, 12b, 12c, 12d, 12e, and 12f)

Terminal pads 12a, 12b, 12c, 12d, 12e, and 12f will be described. Functions presented below are examples, and the functions of the terminal pads 12a, 12b, 12c, 12d, 12e, and 12f are not limited thereto.

The terminal pad 12a is, for example, a terminal for inputting a positive voltage from a power source. The terminal pad 12b is, for example, a terminal for inputting a device enable signal for controlling on/off of the electronic device 10 from the controller. The terminal pad 12c is, for example, a terminal for inputting a ground potential.

The terminal pad 12d is, for example, a terminal that supplies positive power to an external load. The terminal pad 12e is, for example, a terminal that outputs a power good signal indicating whether or not an output voltage of the electronic device 10 has a set voltage value. The terminal pad 12f is a terminal for inputting the ground potential.

(Power Generating Device 20)

Figure 4:
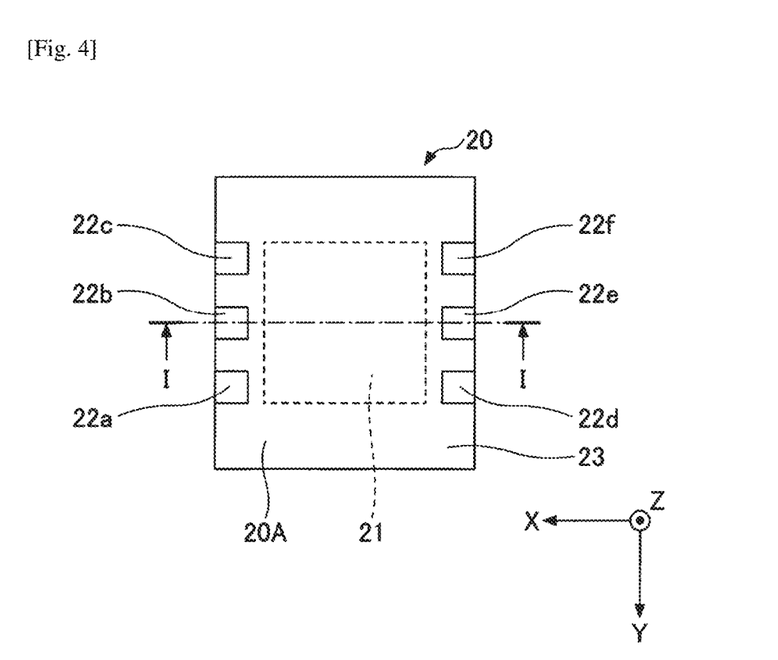
FIG. 4 is a top view of the power generating device of the control board according to the present embodiment.
Figure 5:
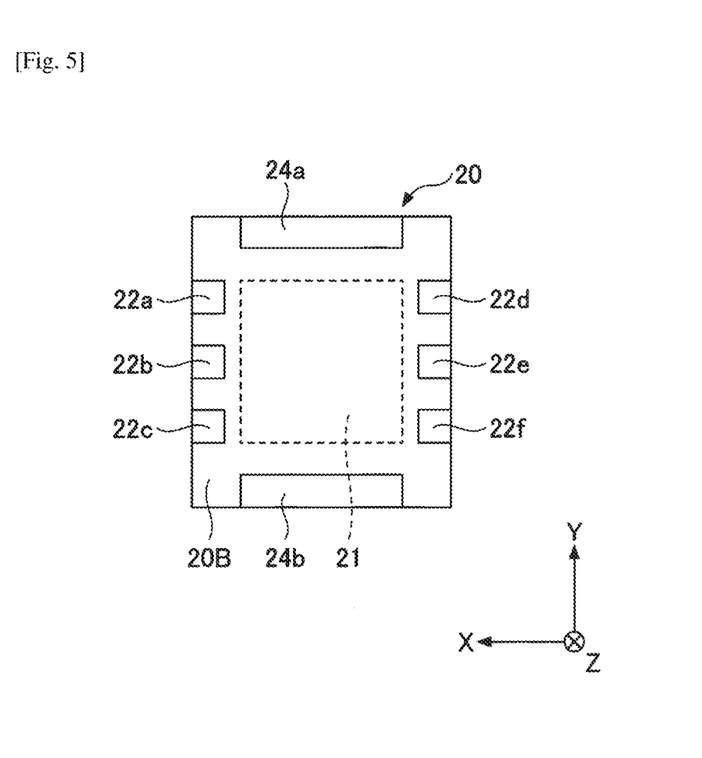
FIG. 5 is a bottom view of the power generating device of the control board according to the present embodiment.
Figure 6:
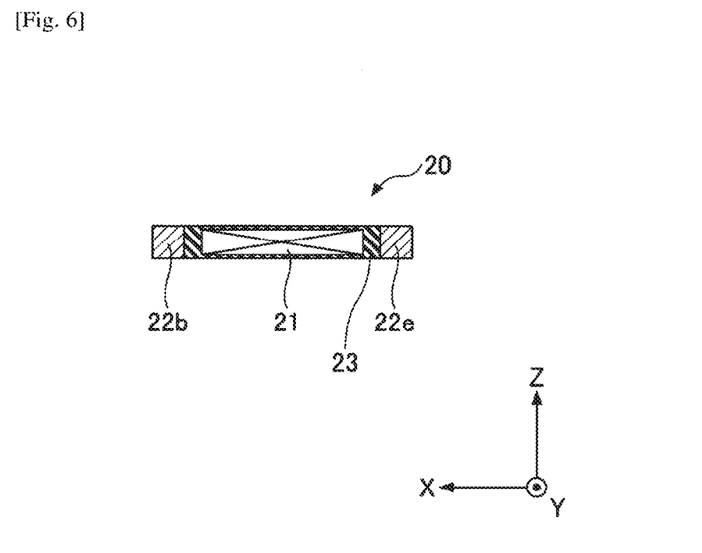
FIG. 6 is a cross-sectional view of the power generating device of the control board according to the present embodiment.

Next, the power generating device 20 will be described. FIG. 4 is a top view of the power generating device 20 of the control board 1 according to the present embodiment. FIG. 5 is a bottom view of the power generating device 20 of the control board 1 according to the present embodiment. FIG. 6 is a cross-sectional view of the power generating device 20 of the control board 1 according to the present embodiment. Specifically, FIG. 6 is a cross-sectional view taken along the line I-I of FIG. 4. In FIG. 6, detailed structure of a Peltier device 21 is omitted and illustrated by intersecting diagonal lines.

The power generating device 20 has a housing 23 which is an insulator. The power generating device 20 includes the Peltier device 21 inside the housing 23. The Peltier device 21 is located between the heat dissipating pad 11 of the electronic device 10 and the heat dissipating pad 31 of the board 30 when the control board 1 is assembled. Further, the power generating device 20 includes metal wirings 22a, 22b, 22c, 22d, 22e and 22f penetrating the first surface 20A and the second surface 20B. Furthermore, the power generating device 20 has a terminal pad 24a and a terminal pad 24b for outputting electric power generated by the Peltier device 21.

In the power generating device 20, the first surface 20A is joined to the heat dissipating pad 11 of the electronic device 10. Further, the second surface 20B is joined to the heat dissipating pad 31 of the board 30. That is, the power generating device 20 is located between the electronic device 10 and the board 30. When the control board 1 is assembled, the Peltier device 21 is located between the heat dissipating pad 11 of the electronic device 10 and the heat dissipating pad 31 of the board 30, so that the Peltier device 21 generates electric power.

The Peltier device 21 outputs the generated electric power from the terminal pad 24a and the terminal pad 24b. The terminal pad 24a is a positive terminal, and the terminal pad 24b is a negative terminal.

Metal wirings 22a, 22b, 22c, 22d, 22e and 22f are located corresponding to the terminal pads 12a, 12b, 12c, 12d, 12e and 12f of the electronic device 10, respectively. That is, the metal wirings 22a, 22b, 22c, 22d, 22e and 22f are located at the same positions as the terminal pads 12a, 12b, 12c, 12d, 12e and 12f of the electronic device 10, respectively, in the top view.

In the control board 1 of the present embodiment, since the power generating device 20 is sandwiched between the electronic device 10 and the board 30, the terminal pads 12a, 12b, 12c, 12d, 12e and 12f of the electronic device 10 cannot be directly connected to the terminal pads 32a, 32b, 32c, 32d, 32e and 32f of the board 30, respectively.

Therefore, the power generating device 20 of the control board 1 of the present embodiment includes the metal wirings 22a, 22b, 22c, 22d, 22e, and 22f. The terminal pads 12a, 12b, 12c, 12d, 12e and 12f of the electronic device 10 can be electrically connected to the terminal pads 32a, 32b, 32c, 32d, 32e and 32f of the board 30, respectively, by the metal wirings 22a, 22b, 22c, 22d, 22e and 22f. Therefore, the electronic device 10 operates normally.

Shapes of each of the metal wirings 22a, 22b, 22c, 22d, 22e and 22f may be appropriately changed according to the signal propagating in the metal wirings and electrical characteristics such as voltage and current.

(Board 30)

Next, the board 30 will be described. As illustrated in FIG. 2, the board 30 has a top surface 30A and a bottom surface 30B. The board 30 has the heat dissipating pad 31, terminal pads 32a, 32b, 32c, 32d, 32e and 32f, and terminal pad 34a and terminal pad 34b on the top surface 30A.

The heat dissipating pad 31 serves as the ground potential (common potential) of the board 30. The heat dissipating pad 31 has a large area on the board 30. The heat dissipating pad 31 releases heat from other components by coming into contact with the components.

The terminal pads 32a, 32b, 32c, 32d, 32e and 32f are connected to the terminal pads 12a, 12b, 12c, 12d, 12e and 12f of the electronic device 10, respectively. For example, the terminal pad 32a is connected to the terminal pad 12a via the metal wiring 22a. Similarly, the terminal pad 32b is connected to the terminal pad 12b via the metal wiring 22b. The terminal pad 32c is connected to the terminal pad 12c via the metal wiring 22c. The terminal pad 32d is connected to the terminal pad 12d via the metal wiring 22d. The terminal pad 32e is connected to the terminal pad 12e via the metal wiring 22e. The terminal pad 32f is connected to the terminal pad 12f via the metal wiring 22f.

The terminal pad 34a and the terminal pad 34b input the electric power generated by the Peltier device 21. The terminal pad 34a and the terminal pad 34b are connected to the terminal pad 24a and the terminal pad 24b, respectively.

The board 30 has a power supply circuit 50 that reuses the electric energy generated by the Peltier device 21, which will be described later.

<Circuit Configuration of Control Board 1>

Figure 7:
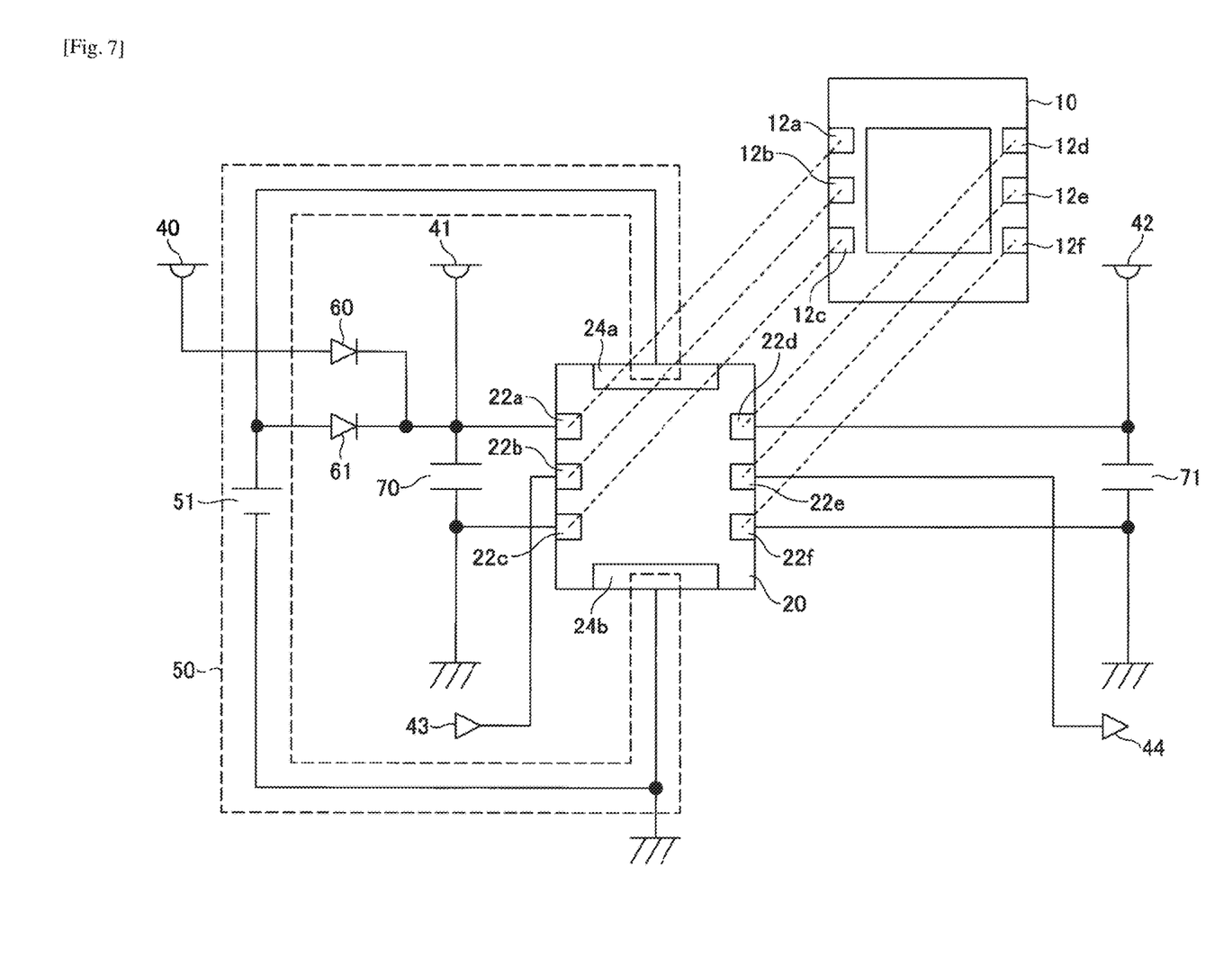
FIG. 7 is a block diagram of the control board according to the present embodiment.

Next, a circuit configuration of the control board 1 of the present embodiment will be described. FIG. 7 is a block diagram of the control board 1 according to the present embodiment.

The control board 1 includes a rechargeable secondary battery 51, a diode 60 and a diode 61, and a capacitor 70 and a capacitor 71. The control board 1 includes a terminal 40 for supplying a positive side voltage from an external power supply unit, a terminal 41 for detecting an input voltage of the electronic device 10, a terminal 42 for supplying a positive voltage from the electronic device 10 to an external load, a terminal 43 for inputting the device enable signal of the electronic device 10, and a terminal 44 for outputting the power good signal of the electronic device 10.

The control board 1 is provided with the electronic device 10 laid over the power generating device 20. In FIG. 7, the electronic device 10 is displaced from the power generating device 20 to explain an electrical connection. Further, connection between terminals of the electronic device 10 and the metal wirings of the power generating device 20 is represented by dotted lines.

The external power supply unit supplies power from the terminal 40 to the terminal pad 12a via the diode 60 and the metal wiring 22a. The terminal 41 is electrically connected to the metal wiring 22a and the terminal pad 12a. The terminal pad 12b is connected to the terminal 43. The terminal pad 12c is connected to a ground pattern. The terminal pad 12a and the terminal pad 12c are connected via the capacitor 70 in order to remove high frequency noise. High frequency noise flows through the capacitor 70 to the ground pattern.

The terminal 41 is also used as an input voltage for an electronic device other than the electronic device 10 (not illustrated).

The terminal pad 12d is connected to the terminal 42. The terminal pad 12e is connected to the terminal 44. The terminal pad 12f is connected to the ground pattern. The terminal pad 12d and the terminal pad 12f are connected via the capacitor 71 in order to remove high frequency noise. High frequency noise flows through the capacitor 71 to the ground pattern.

The power generating device 20 outputs the electric energy generated from the Peltier device 21 from the terminal pad 24a and the terminal pad 24b of the power generating device 20. The terminal pad 24a is connected to the positive terminal of the secondary battery 51. The terminal pad 24a is connected to the terminal pad 12a via the diode 61 and the metal wiring 22a. The terminal pad 24b is connected to the negative terminal of the secondary battery 51. Further, the terminal pad 24a is connected to the ground pattern.

The power generating device 20 charges the rechargeable secondary battery 51 by utilizing a voltage difference generated between the positive side terminal pad 24a and the negative side terminal pad 24b. The power generating device 20 supplies electric power to the electronic device 10 by utilizing the voltage difference generated between the positive side terminal pad 24a and the negative side terminal pad 24b.

The control board 1 of the present embodiment supplies the electric power charged in the secondary battery 51, the electric power generated by the Peltier device 21, and the electric power from the external power supply unit to the electronic device 10 via the diode 60 or the diode 61.

In the control board 1, the electric energy generated from the Peltier device 21 serves as an input power source for the electronic device 10, and surplus electric energy is stored in the secondary battery 51. By storing electricity in the secondary battery 51, it is possible to supply electric power from the secondary battery 51 when more electric power is required in the electronic device 10. When the power from the secondary battery 51 is insufficient, the power is further supplied from an external power supply unit.

The heat dissipating pad 31 is an example of a first heat dissipating pad, and the heat dissipating pad 11 is an example of a second heat dissipating pad. A circuit connected from the terminal pad 24a to the terminal pad 24b via the secondary battery 51 is an example of the power supply circuit 50 that reuses the electric energy converted from the heat energy by the Peltier device 21.

<Modified Example>

In the above description, the power supply IC has been described as an example of the electronic device 10. The electronic device 10 is not limited to the power supply IC. For example, the electronic device 10 may be a processor such as a CPU (Central Processing Unit).

A processor such as a CPU is a device that handles high-speed signals having a frequency of several hundred MHz or more. When transmitting a high-speed signal, it is desirable to match characteristic impedances of devices, circuit board wiring, and transmission lines such as connectors in order to prevent deterioration of signal waveform quality due to distortion such as signal reflection.

Figure 8:
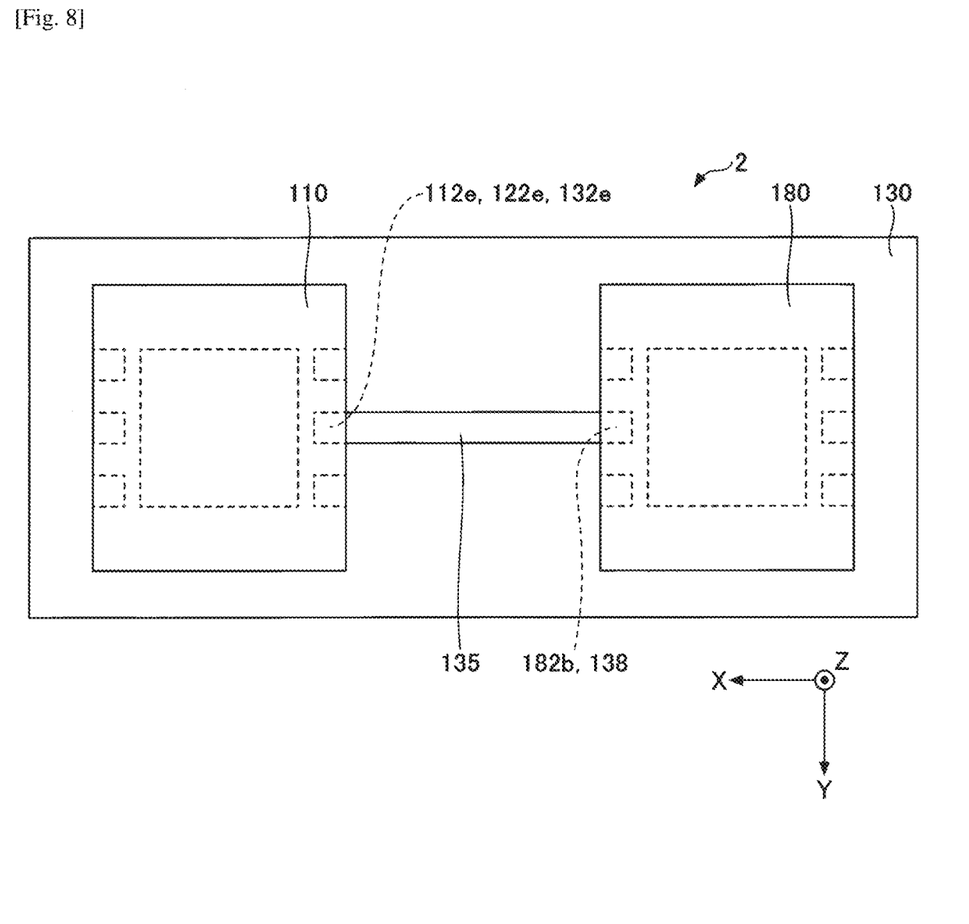
FIG. 8 is a top view of a modified example of the control board according to the present embodiment.
Figure 9:
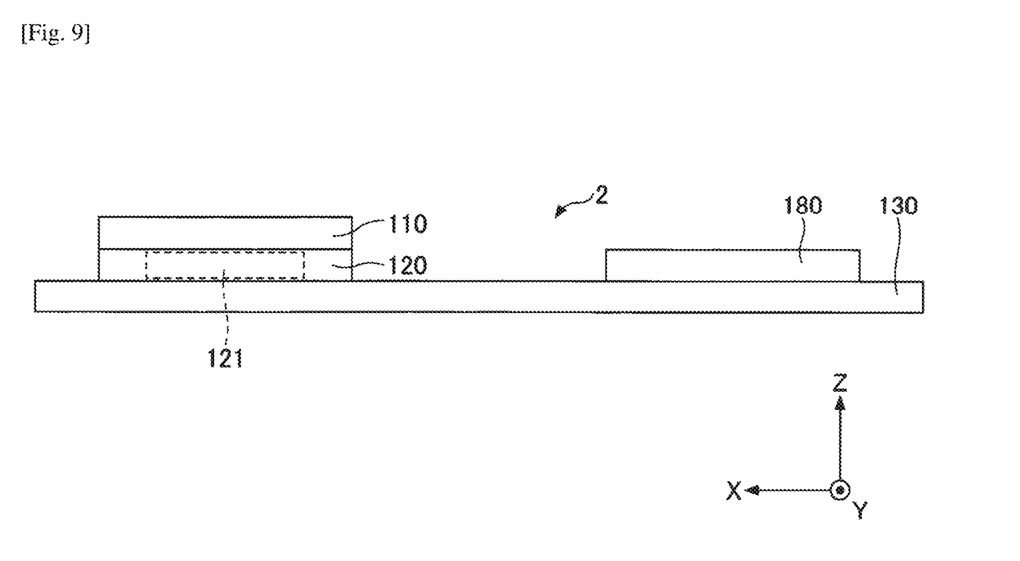
FIG. 9 is a side view of a modified example of the control board according to the present embodiment.

FIG. 8 is a top view of a control board 2, which is a modified example of the control board 1 according to the present embodiment. FIG. 9 is a side view of the control board 2, which is the modified example of the control board 1 according to the present embodiment.

The control board 2 includes an electronic device 110, a power generating device 120, an electronic device 180, and a board 130.

The electronic device 110 is, for example, a processor such as a CPU. The electronic device 110 is a device that generates heat when operated. Similar to the electronic device 10, the electronic device 110 includes a plurality of terminal pads and heat dissipating pads. The terminal pad 112e among the plurality of terminal pads is connected to a high-speed signal line 135. Therefore, the high-speed signal propagates to the terminal pad 112e.

The power generating device 120 is located between the electronic device 110 and the board 130. The power generating device 120 generates power by using the temperature difference between the electronic device 110 and the board 130. The power generating device 120 includes a Peltier device 121 and a plurality of metal wirings similar to the power generating device 20. The metal wiring 122e among the plurality of metal wirings is connected to the high-speed signal line 135 via a terminal pad 132e provided on a surface of the board 130. Therefore, the high-speed signal propagates through the metal wiring 122e.

The electronic device 180 is a driver IC that processes high-speed signals. The electronic device 180 is, for example, an IC that processes a USB (Universal Serial Bus) signal. Similar to the electronic device 10, the electronic device 180 includes a plurality of terminal pads and heat dissipating pads. The terminal pad 182b among the plurality of terminal pads is connected to the high-speed signal line 135 via the terminal pad 138 provided on the surface of the board 130. Therefore, the high-speed signal propagates to the terminal pad 182b. The heat dissipating pad of the electronic device 180 is connected to the heat dissipating pad included in the board 130.

The board 130 is a circuit board on which the electronic device 110, the power generating device 120, and the electronic device 180 are mounted. Similar to the board 30, the board 130 includes a power supply circuit that reuses the electric energy generated by the power generating device 120. The board 130 includes the high-speed signal line 135 that transmits the high-speed signal to the surface of the board.

In order to maintain the signal waveform quality of the high-speed signal propagating through the high-speed signal line 135, it is desirable to match the characteristic impedances of the high-speed signal line 135, the terminal pad 132e through which the high-speed signal propagating through the high-speed signal line 135 passes, the metal wiring 122e, and the terminal pad 112e. That is, it is desirable that the metal wiring 122e is impedance matched between the electronic device 110 and the board 130.

Furthermore, it is desirable that the characteristic impedances of the high-speed signal line 135 and the terminal pad 182b of the electronic device 180 match.

In the present modified example, the power generating device 120 is provided between the electronic device 110 that generates heat and the board 130. Further, by making the metal wiring included in the power generating device 120 have the equivalent characteristic impedance as that of the electronic device 110 and the board 130, distortion such as reflection can be prevented and high-speed signals can be supported.

The power generating device of the present embodiment may be provided between the electronic device 180 and the board 130.

<Operation and Effect>

In the control board 1 of the present embodiment, the power generating device 20 is provided between the electronic device 10 which generates heat and the board 30. By providing the power generating device 20 between the electronic device 10 and the board 30, heat from the electronic device 10 can be efficiently converted into electric energy. Further, by providing the power generating device 20 between the electronic device 10 and the board 30, wiring between the power generating device 20 and the power supply circuit 50 that reuses the electric energy generated by the power generating device 20 can be easily performed.

Further, since the power generating device 20 is provided with metal wiring, wiring between the electronic device 10 and the board 30 can be easily performed.

<Application Example>

Figure 10:
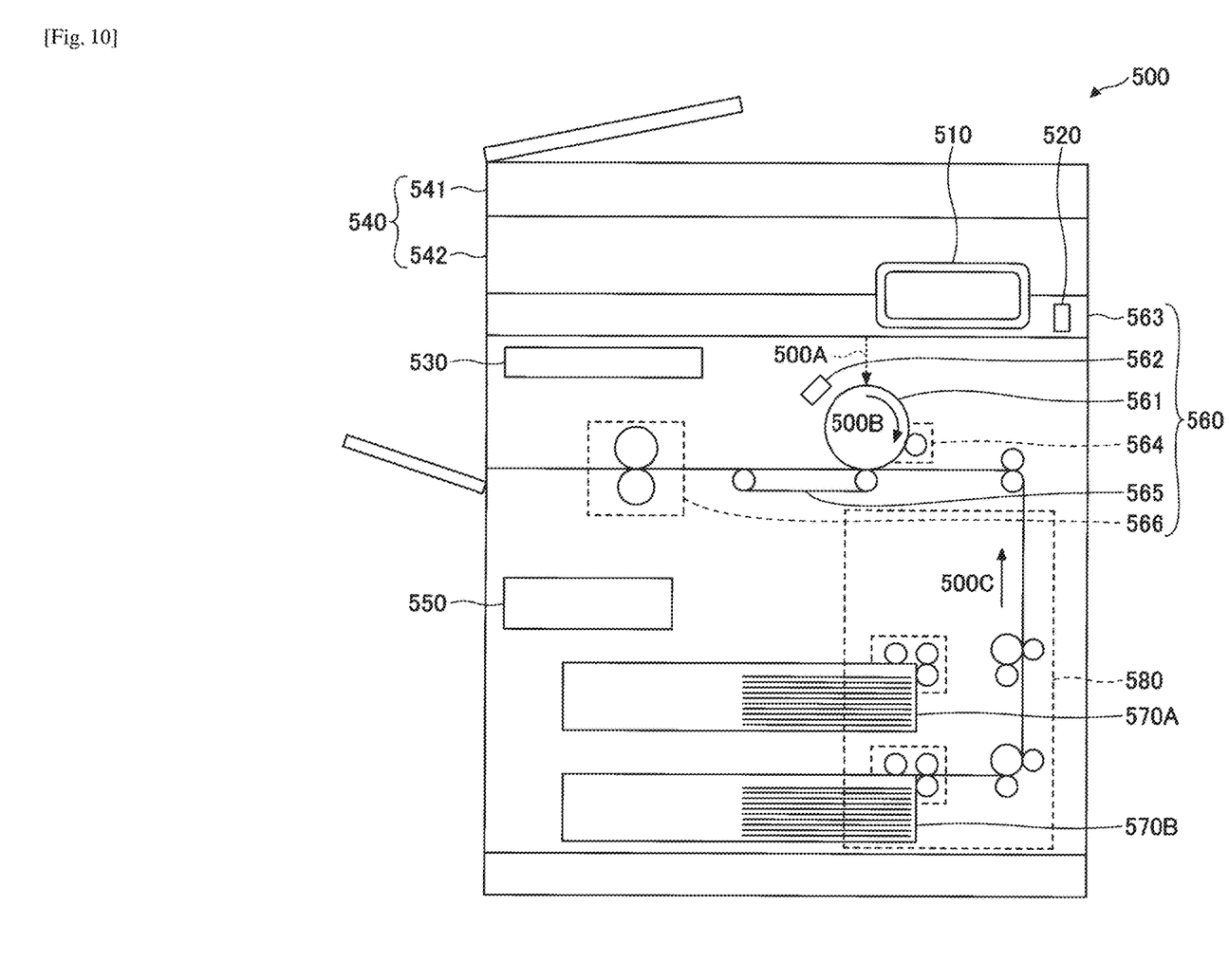
FIG. 10 is a diagram illustrating a configuration example of an image forming apparatus which is an example of an electronic equipment according to the present embodiment.

FIG. 10 is a diagram illustrating a configuration example of an image forming apparatus 500, which is an example of the electronic equipment according to the present embodiment. For example, the control board of the present embodiment is suitable for use as a power supply control board for an image forming apparatus.

The image forming apparatus 500 is a multifunction device called an MFP (Multi Functional Peripheral/Printer). The image forming apparatus 500 combines a copy function, a fax function, a printer function, a scanner function, a function of storing and distributing an input image (a document read by the scanner function, and an image input by the printer function or the fax function), and the like.

The image forming apparatus 500 can also communicate with an external device such as a PC (Personal Computer), and can also perform an operation according to an instruction received from the external device. In the embodiment, the "image" processed by the image forming apparatus 500 includes not only image data but also data that does not include image data, that is, data that includes only text information.

The image forming apparatus 500 is a so-called electrophotographic image forming apparatus which adheres toner to an electrostatic latent image written by selectively exposing a surface of a charged photoconductor, and transfers the adhered toner to a recording medium such as paper.

The image forming apparatus 500 includes an operation panel 510, an activation switch 520, a controller 530, a reading unit 540, an engine control unit 550, a printer unit 560, a paper feeding cassette 570A, 570B, and a conveying unit 580.

The operation panel 510, which is an operation unit, receives various inputs according to the user's operation, and displays various types of information (for example, information indicating the received operation, information indicating an operating status of the image forming apparatus 500, information indicating a setup condition of the image forming apparatus 500, and the like). The operation panel 510 includes a liquid crystal display (LCD) equipped with a touch panel function as an example, however, a configuration of the operation panel 510 is not limited thereto. For example, the operation panel 510 may include an organic EL (Electro-Luminescence) display device equipped with the touch panel function. Further, in addition to or in place of this, an operation unit such as a hardware key and a display unit such as a lamp may be provided.

The activation switch 520 activates the image forming apparatus 500 when pressed by the user while power of the image forming apparatus 500 is off. When the image forming apparatus 500 is pressed by the user while the image forming apparatus 500 is activated, that is, when the power is on, the image forming apparatus 500 is turned off. The image forming apparatus 500 may be turned on/off by pressing the activation switch 520 by the user in this way, but the present embodiment is not limited to this, and the image forming apparatus 500 may be turned on/off based on an instruction received from the external device.

The controller 530 comprehensively controls the image forming apparatus 500 based on the operation input of the operation panel 510 and the like. As an example, the image forming apparatus 500 is made to execute an operation according to an operation or information received by the operation panel 510. As another example, the image forming apparatus 500 is made to execute an instruction and the like received by the image forming apparatus 500 from an external device such as a PC. As yet another example, when a specific condition is detected, for example, when a press of the activation switch 520 is detected, the image forming apparatus 500 is made to execute a predetermined operation. As yet another example, when an abnormality that has occurred in the image forming apparatus 500 is detected, the image forming apparatus 500 is made to execute a predetermined operation.

A specific example of the controller 530 is a controller board equipped with a circuit that comprehensively controls the image forming apparatus 500. As an example, a CPU (Central Processing Unit), a ROM (Read Only Memory), and a RAM (Random Access Memory) are mounted on a circuit that comprehensively controls the image forming apparatus 500. The controller 530 controls the image forming apparatus 500 by the CPU using the RAM as a work area and executing a program stored in the ROM and the HDD (Hard Disk Drive).

The reading unit 540 reads the document. The reading unit 540 includes an ADF (Auto Document Feeder) 541 and a scanner unit 542. The ADF 541 sequentially conveys the documents placed on the ADF 541 and optically reads them to generate image data. The scanner unit 542 fixes the document on a transparent platen, optically reads the fixed document, and generates image data.

The engine control unit 550 generates a control signal for controlling the printer unit 560 and the conveying unit 580 based on the image data generated by the reading unit 540. A specific example of the engine control unit 550 is a circuit board for generating a control signal based on the image data.

The printer unit 560 is an image forming unit that forms an image on a recording medium such as paper. The printer unit 560 forms a toner image on the recording medium. The printer unit 560 includes a photoconductor drum 561 as a photoconductor, a charging member 562, a writing unit 563, a developing member 564, a conveying belt 565, and a fixing portion 566. The charging member 562 charges the outer surface of the photoconductor drum 561. The writing unit 563 exposes the charged photoconductor drum 561 based on the image data read by the reading unit 540, and writes an electrostatic latent image on the photoconductor. The developing member 564 develops the written latent image with toner. The conveying belt 565 conveys the recording medium that forms the toner image. The fixing portion 566 fixes the toner on the recording medium to the recording medium.

The paper feeding cassettes 570A and 570B store the recording medium before image formation. In FIG. 10, two paper feeding cassettes are provided as an example, and recording media having different sizes are stored in each of the paper feeding cassettes, but one or three or more of the paper feeding cassette(s) may be used.

The conveying unit 580 conveys the recording medium as a paper feeding and conveying unit. The conveying unit 580 includes various rollers. The conveying unit 580 conveys the recording medium housed in the paper feeding cassette 570A and the paper feeding cassette 570B to the printer unit 560 along an arrow 500C.

Here, a flow of image formation in the image forming apparatus 500 will be described by taking a copy mode as an example. First, the user operates a function switching key or the like on the operation panel 510 to sequentially switch and select the copy function, the printer function, and a facsimile function of the image forming apparatus 500. This makes each function operate. When the copy function is selected, the copy mode is set, when the printer function is selected, a printer mode is set, and when the facsimile function is selected, a facsimile mode is set.

In the copy mode, the reading unit 540 reads the image information of each document to be copied and generates image data.

The outer peripheral surface of the photoconductor drum 561 is uniformly charged by the charging member 562 in the dark and then exposed by irradiation light from the writing unit 563 (indicated by a dotted arrow 500A in FIG. 10), and as a result, an electrostatic latent image is formed on the outer peripheral surface of the photoconductor drum 561. The developing member 564 makes this electrostatic latent image into a visual image with toner. As a result, a toner image is formed on the photoconductor drum 561. The photoconductor drum 561 rotates in the direction of arrow 500B. Then, the toner image formed on the photoconductor drum 561 is transferred to the recording medium on the conveying belt 565. Then, the fixing portion 566 heats and melts the toner of the toner image on the recording medium with a heater as an example, fixes the toner image on the recording medium, and discharges the recording medium from the image forming apparatus 500.

Although the case where the printer unit 560 forms an image by a monochrome electrophotographic method has been described, the image forming method is not limited thereto. The image forming method may be a color electrophotographic method, an inkjet method, and the like.

The operation panel 510 described above may be controlled by the controller 530, or may be controlled by a control circuit for controlling the operation panel 510 provided separately from the controller 530. In this case, the control circuit of the controller 530 and the control circuit of the operation panel 510 are connected to each other so as to communicate with each other, and the controller 530 controls the entire image forming apparatus 500 including the operation panel 510.

The controller 530, the engine control unit 550, the printer unit 560, the paper feeding cassette 570A and 570B, and the conveying unit 580 are provided inside the exterior of the image forming apparatus 500. In FIG. 10, the inside of the image forming apparatus 500 is perspectively illustrated.

By using the control board of the present embodiment for the image forming apparatus 500, wasted heat such as waste heat inside the image forming apparatus 500 is utilized to generate electricity using the Peltier device, and the generated electric energy can be stored in the secondary battery. By storing the generated electric energy in the secondary battery, the electric power of the image forming apparatus 500 in an energy-saving operation can be supplied from the secondary battery, so the electric power other than the supplied electric power can be reduced to 0 W in the energy-saving operation.

As the waste heat inside the image forming apparatus 500, the waste heat of the fixing portion 566 for melting the toner of the image forming apparatus 500 can be considered. However, the fixing portion 566 emits heat only when printing with the image forming apparatus 500. Therefore, the fixing portion 566 is not able to generate enough electric energy to meet the electric power in the energy-saving operation of the image forming apparatus 500. On the other hand, the control board of the present embodiment can be used as a power source for the electric power in the energy-saving operation because the control board of the present embodiment generates electric energy by using the waste heat of a portion such as the power supply IC that constantly emits heat.

Although the image forming apparatus 500 is described as an example of the electronic equipment, the control board of the present embodiment can be applied not only to the image forming apparatus 500 but to other electronic equipment provided with the electronic device that generates heat such as the power supply control IC, and a processor such as a CPU.

The present invention is not limited to the configurations presented above. It is possible to combine the configurations and the like described in the above embodiment with other elements. Regarding these, changes can be made without departing from the gist of the present invention, and the scope can be appropriately determined according to the application form.

The present application is based on and claims priority to Japanese Patent Application No. 2020-189783, filed Nov. 13, 2020, the contents of which are incorporated herein by reference in their entirety.

REFERENCE SIGNS LIST 1, 2 control board
10, 110 electronic device
11 heat dissipating pad
12a, 12b, 12c, 12d, 12e, 12f, 112e terminal pad
20, 120 power generating device
20A first surface
20B second surface
21, 121 Peltier device
22a, 22b, 22c, 22d, 22e, 22f, 122e metal wiring
23 housing
24a, 24b terminal pad
30, 130 board
30A top surface
30B bottom surface
31 heat dissipating pad
32a, 32b, 32c, 32c, 32e, 32f, 132e, 138 terminal pad
34a, 34b terminal pad
40, 41, 42, 43, 44 terminal
50 power supply circuit
51 secondary battery
60, 61 diode
70, 71 capacitor
135 high-speed signal line
180 electronic device
182b terminal pad
500 image forming apparatus
500A, 500B, 500C arrow
510 operation panel
520 activation switch
530 controller
540 reading unit
541 ADF
542 scanner unit
550 engine control unit
560 printer unit
561 photoconductor drum
562 charging member
563 writing unit
564 developing member
565 conveying belt
566 fixing portion
570A, 570B paper feeding cassette
580 conveying unit

The invention claimed is:

1. A control board comprising:
a board including a first heat dissipating pad;
an electronic device including a second heat dissipating pad to dissipate heat; and
a power generating device including
a Peltier device configured to convert heat energy generated from the electronic device into electric energy, and
wiring configured to connect a first terminal of the electronic device and a second terminal of the board,
wherein the power generating device is sandwiched between the first heat dissipating pad and the second heat dissipating pad.

2. The control board according to claim 1, wherein the wiring is impedance matched between the electronic device and the board.

3. An electronic equipment comprising the control board of claim 1.

4. An image forming apparatus comprising the control board of claim 1.

5. The control board according to claim 1, further including a power supply circuit configured to reuse the electric energy.

6. The control board according to claim 1, wherein the first terminal of the electronic device is connected to the first heat dissipating pad and the second terminal of the board is connected to the second heat dissipating pad.

7. The control board according to claim 1, wherein the electronic device is indirectly provided on the board via the power generating device.

8. The control board according to claim 1, wherein the board and the electronic device are at positions facing each other with the power generating device sandwiched between the board and the electronic device.

9. The control board according to claim 1, wherein the power generating device includes a first surface joined to the second heat dissipating pad and a second surface joined to the first heat dissipating pad.

10. The control board according to claim 1, wherein the power generating device includes a first surface joined to the second heat dissipating pad and a second surface joined to the first heat dissipating pad, and
   wherein the wiring penetrates the first surface and the second surface.

11. The control board according to claim 1, wherein the first terminal, the second terminal, and the wiring are located at a same position in a top view.

* * * * *